United States Patent
Park

(10) Patent No.: US 6,573,532 B2
(45) Date of Patent: *Jun. 3, 2003

(54) THIN FILM TRANSISTOR ARRAY PANEL FOR LIQUID CRYSTAL DISPLAY

(75) Inventor: Woon-Yong Park, Kyungki-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

This patent is subject to a terminal disclaimer.

(21) Appl. No.: 10/090,143

(22) Filed: Mar. 5, 2002

(65) Prior Publication Data

US 2002/0097349 A1 Jul. 25, 2002

Related U.S. Application Data

(63) Continuation of application No. 09/705,928, filed on Nov. 6, 2000.

(30) Foreign Application Priority Data

Nov. 5, 1999 (KR) ............................................. 99-48842
Sep. 28, 2000 (KR) ......................................... 2000-57036

(51) Int. Cl.[7] .................. H01L 29/04; H01L 31/20; H01L 31/036; H01L 31/0376
(52) U.S. Cl. ..................... 257/59; 257/71; 257/72; 257/296; 257/300; 257/350
(58) Field of Search ..................... 257/59, 71, 72, 257/296, 300, 350

(56) References Cited

U.S. PATENT DOCUMENTS

| | | |
|---|---|---|
| 5,757,453 A | 5/1998 | Shin et al. |
| 6,066,860 A | 5/2000 | Katayama et al. |
| 6,403,980 B1 * | 6/2002 | Park ............................ 257/59 |

* cited by examiner

*Primary Examiner*—Ngân V. Ngô
(74) *Attorney, Agent, or Firm*—McGuireWoods LLP; Hae-Chan Park

(57) ABSTRACT

A plurality of gate lines extending in a horizontal direction are formed on an insulating substrate, and a data line is formed perpendicular to the gate line thereby defining a pixel of a matrix array. Pixel electrodes receiving image signals through the data line are formed in a pixel, and a thin film transistor having a gate electrode connected to the gate line, a source electrode connected to the data line, and a drain electrode connected to the pixel electrode is formed on the portion where the gate lines and the data lines intersect. A storage wire including a storage electrode line is formed in the horizontal direction, and a storage electrode connected to the storage electrode line and forming a storage capacitance by overlapping the pixel electrode is formed in the pixel. A redundant repair line both ends of which overlap the storage wire of the neighboring pixel, and a storage wire connection line connecting the storage wires of a neighboring pixel are formed. In this structure, because the storage wires of a neighboring pixel are connected to each other through the storage wire connection line, the variation of the voltage for the storage capacitance may be minimized, and this results in a reduction of its distortion, such that crosstalk and flicker problems are minimized.

11 Claims, 18 Drawing Sheets

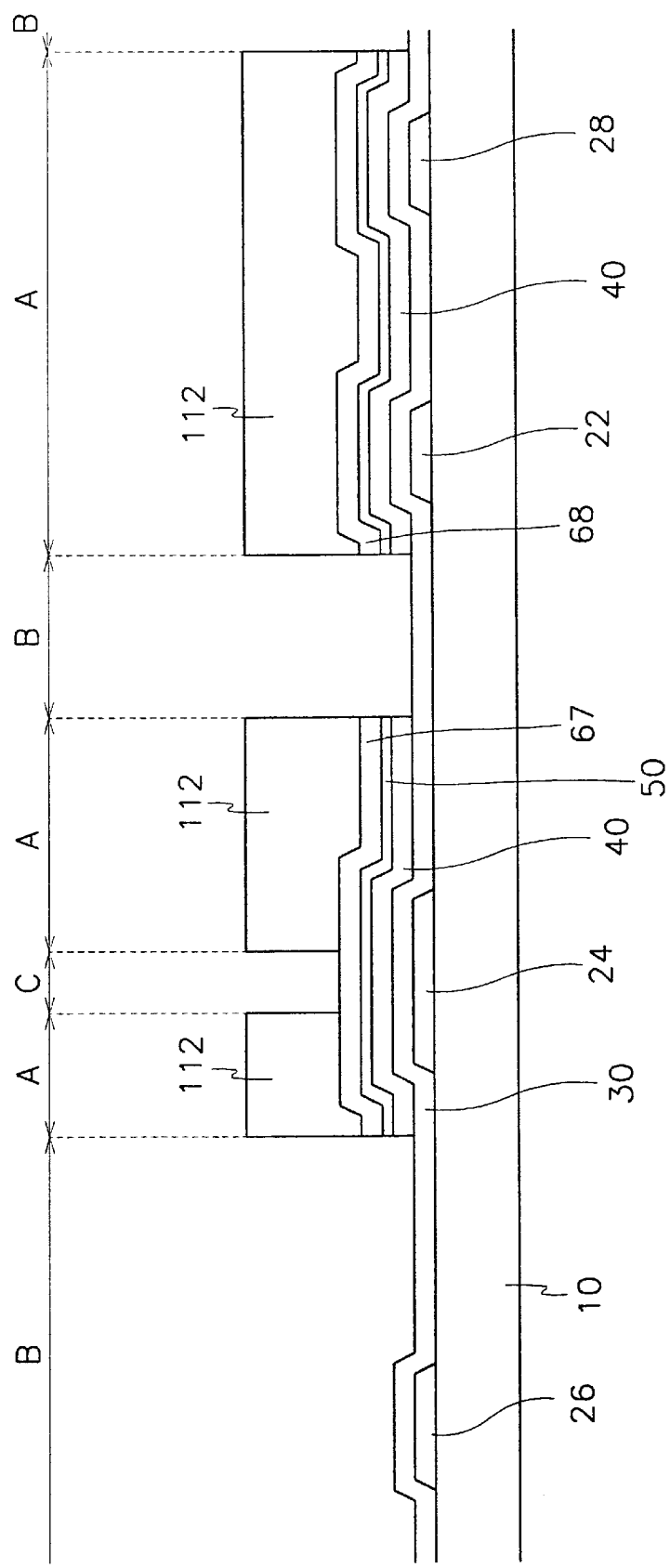

THIN FILM TRANSISTOR ARRAY PANEL FOR LIQUID CRYSTAL DISPLAY

This is a continuation of application Ser. No. 09/705,928 filed Nov. 6, 2000.

BACKGROUND OF THE INVENTION (a) Field of the Invention

The present invention relates to a thin film transistor array panel for a liquid crystal display. More particularly, the present invention relates to a thin film transistor array panel for a liquid crystal display having independent storage wires to form a storage capacitance.

(b) Description of the Related Art

Liquid crystal displays (LCDs) are one of the most widely used flat panel display (FPD) configurations. The liquid crystal display has two panels having electrodes for generating an electric field and a liquid crystal layer interposed between the two panels. The transmittance of incident light is controlled by the intensity of the electric field applied to the liquid crystal layer.

In the most widely used liquid crystal displays, field-generating electrodes (common and pixel electrodes) are respectively formed on both of the panels, and one of the panels has switching elements such as thin film transistors to control an image signal applied to the pixel electrode.

A typical liquid crystal display uses a thin film transistor as a switching element. Data lines and gate lines, which cross each other and define pixels in a matrix array, are formed on the panel on which the thin film transistors are disposed. Further, a pixel electrode, which receives an image signal from the data lines through the thin film transistor and generates an electric field with a common electrode, is formed in each pixel.

In the thin film transistor array panel for a liquid crystal display, a storage electrode line is formed overlapping the pixel electrode via an insulating layer and provides storage capacitance along with the pixel electrode to improve the capacitance of a liquid crystal capacitor. Generally, a common signal applied to the common electrode formed on another panel, or a gate signal applied to the gate line, is applied to the storage electrode line.

However, during the operation of the liquid crystal display, the voltage applied to the storage electrode is changed due to continuous variation of image signals transmitted to the data line, and the resistance due to storage capacitance distorts a potential of the storage electrode line. This results in a variation of liquid crystal capacitance and an overall reduction in picture quality of the LCD as a result of crosstalk and flicker problems that occur.

SUMMARY OF THE INVENTION

It is an object of the present invention to provide a thin film transistor panel for an LCD that reduces distortion of the voltage applied to a storage electrode line such that crosstalk and flicker problems are minimized.

It is another object of the present invention to provide a thin film transistor panel for an LCD having a wire structure such that repairs of wire open/short defects are easy.

These and other objects are provided, according to the present invention, by forming a redundant line at least connecting storage wires of neighboring pixels to each other, and forming a redundant repair line each ends of which overlap the storage wire of a neighboring pixel.

In a thin film transistor array panel for a liquid crystal display according to the present invention, a gate wire including gate lines is formed in a horizontal direction, a data wire including data lines which intersects and is insulated from said gate wire is formed in a vertical direction, and a pixel electrode which receives image signals through the data line is formed in a pixel defined by an intersection of the gate line and the data line. A storage wire including storage electrode lines and storage electrodes connected to the storage electrode lines, and forming a storage capacitance by overlapping said pixel electrode is formed, and a storage wire connection line at least connecting the storage wires of neighboring pixels is formed.

A redundant repair line ends of which overlap the storage wire of a neighboring pixel may be formed.

It is desirable that the storage wire connection line is formed on the same layer as said pixel electrode, the redundant repair line is formed on the same layer as said data wire, and the storage wires are formed on the same layer as said gate wire.

Also, it is desirable that the storage wires overlap the edge portion of the pixel electrode, and that the pixel electrode has shapes of a plurality of connected squares with rounded corners, an opening pattern in a square shape, saw-toothed shape or cross shape to align liquid crystal molecules in a multi-domain configuration.

More concretely, a gate wire including a gate line transmitting a scanning signal in a horizontal direction, and a gate electrode connected to the gate line is formed on the insulating substrate, and a storage wire including a storage electrode line in a horizontal direction and a storage electrode connected to the storage electrode line is formed on the insulating substrate. A gate insulating layer covering said gate wire and said storage wire, and a semiconductor layer made of semiconductor material are formed. A data wire including a data line formed in a vertical direction and defining a pixel of a matrix array by intersecting the gate line, a source electrode connected to the data line and extended on the semiconductor layer, and a drain electrode extended on the semiconductor layer and separated from the source electrode with respect to the gate electrode is formed, and a passivation layer covering the semiconductor layer is formed. A pixel electrode electrically connected to the drain electrode in the pixel and forming a storage capacitance by overlapping the storage wire, and a storage wire connection line at least connecting the storage wire of neighboring pixels are formed.

It is desirable that the pixel electrode and the storage wire connection line are formed on the same layer as each other, and are formed on said passivation layer. Also, a redundant repair line formed on the same layer as the data wire with both ends overlapping the storage wires of a neighboring pixel may be added.

BRIEF DESCRIPTION OF THE DRAWINGS

The accompanying drawings, which are incorporated in and constitute a part of the specification, illustrate an embodiment of the invention, and, together with the description, serve to explain the principle of the invention.

FIGS. 5A to 5G are cross-sectional views of the thin film transistor array panel for the liquid crystal display of another manufacturing method according to the first embodiment of the present invention.

DETAILED DESCRIPTION OF THE PREFERRED EMBODIMENTS

Figure 1:
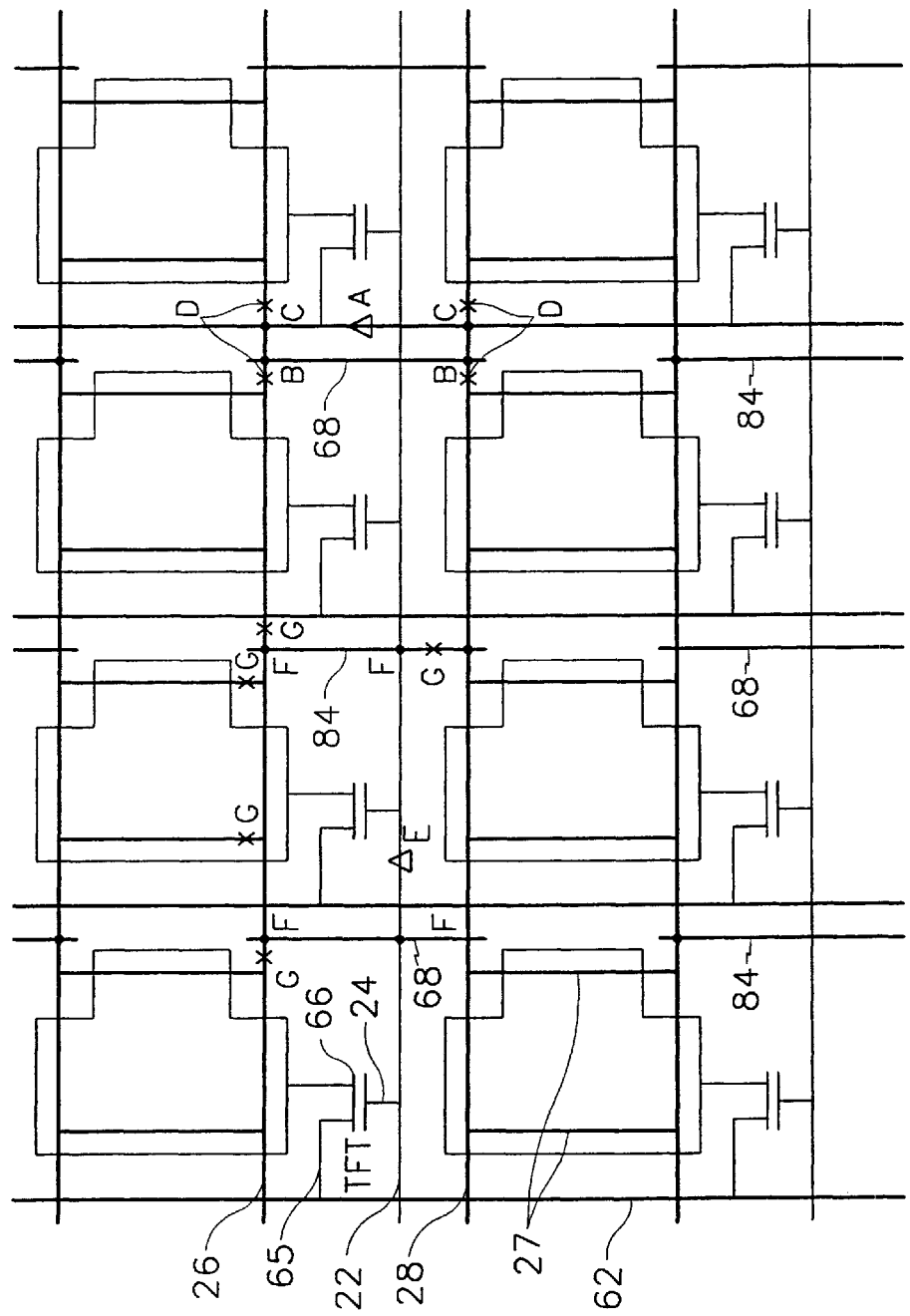
FIG. 1 is a wire view of a thin film transistor array panel for a liquid crystal display according to the first embodiment of the present invention.

The present invention will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

FIG. 1 is a wire view of a thin film transistor array panel for a liquid crystal display according to the first embodiment of the present invention.

As shown in FIG. 1, in a thin film transistor array panel for a liquid crystal display according to the first embodiment of the present invention, a plurality of gate lines 22 transmitting a scanning signal and a plurality of data lines 62 transmitting a display signal or an image signal cross each other. The gate lines 22 and the data lines 62 define a plurality of pixels in a matrix array. Each pixel includes a pixel electrode 82 to which an image signal is applied through the data line and a thin film transistor TFT. Gate and source and drain electrodes of the thin film transistor TFT are respectively connected to the gate line 22, the data line 62, the pixel electrode 82. Also, a plurality of storage electrode lines 26 and 28 that are parallel with the gate line 22 and receives a voltage such as a common voltage applied to a common electrode (not shown) on an upper panel of the liquid crystal display are formed. The storage electrode lines 26 and 28 have a dual-lined structure and are connected to each other through a storage electrode 27, and they are parallel with the data line 62. The storage wires 26, 27 and 28 provide the storage capacitance by overlapping the pixel electrode 82. A storage wire connection line 84 at least electrically connecting storage wires 26, 27 and 28 of neighboring pixels is formed in a vertical direction, and a redundant repair line 68, both ends of which overlap the storage wires 26, 27 and 28 and neighboring pixels is formed.

In the thin film transistor panel for a liquid crystal display according to the present invention, because the storage wires 26, 27 and 28 of neighboring pixels are at least connected to each other through the storage wire connection line 84, the variation of the voltage for the storage capacitance, which is applied to the storage wires 26, 27 and 28 may be minimized, and this results in reduction of its distortion, such that cross-talk and flicker problems are minimized.

Furthermore, in a thin film transistor panel for a liquid crystal display according to the present invention, if the gate line 22 or the data line 62 are respectively disconnected, the disconnection of wire may be repaired by using the redundant repair line 68, the storage wires 26, 27 and 28, and the storage wire connection line 84. This will be described below while referring to FIG. 1.

For example, if the data line 62 is severed at portion A, the C portions overlapping the data line 62 and the storage electrode lines 26 and 28 on both sides of portion A are shorted using a laser, and the B portions overlapping the storage electrode lines 26 and 28, and the redundant repair line 68 on the left side of portion A are shorted using a laser. Accordingly, image signals transmitted to the severed data line 62 are rerouted through the redundant repair line 68 and the storage electrode lines 26 and 28. At this time, the D portions (represented by X) of the storage electrode lines 26 and 28 that are outside of both sides of the portions between B and C are severed to prevent image signals from being transmitted to all of the storage wires 26, 27 and 28.

As a further example, if the gate line 22 is severed at portion E, the F portion overlapping the gate line 22 and the storage wire connection line 84 on the right side of portion E, and the H portions overlapping the redundant repair line 68 and the storage electrode lines 26 on the left side of portion E are shorted using a laser, respectively. Accordingly, scanning signals transmitted to the severed gate line 22 are re-routed through the redundant repair line 68, the storage electrode line 26, and the storage wire connection line 84. At this time, the G portions (represented by X) of the storage electrode line 26 that are outside of both sides of the portions between the H portion and the F portion, the storage electrode 27 connected to the storage electrode line 26 between the F portion and the H portion, and the storage wire connection line 84 between the F portion and the storage electrode line 28 are severed to prevent scanning signals from being transmitted to all of the storage wires 26, 27 and 28. The redundant repair line 68 may be only used to repair the disconnection of the gate line 22 without using the storage wire connection line 84.

Here, the redundant repair line 68 and the storage wire connection line 84 may be formed on the same layer as each other and as the pixel electrode 82 or the data line 62, or not. In the embodiment according to the present invention, the storage wires 26, 27 and 28 are formed on the same layer as the gate line 22, the redundant repair line 68 is formed on the same layer as the data line 62, and the storage wire connection line 84 is formed on the same layer as the pixel electrode 82. This will be described in detail while referring to FIGS. 2 and 3.

Figure 2:
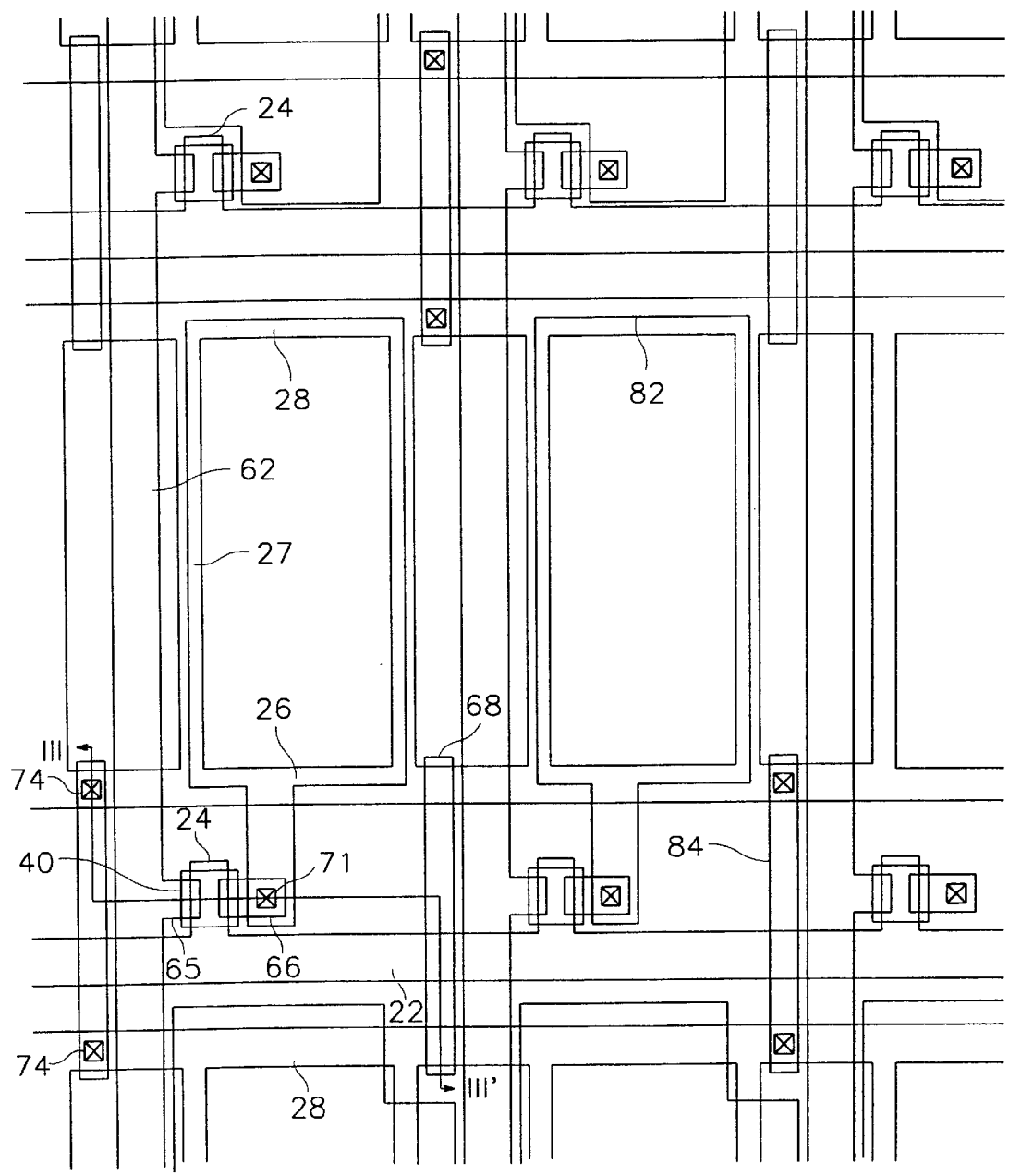
FIG. 2 is a layout view of a thin film transistor array panel for a liquid crystal display according to the first embodiment of the present invention.
Figure 3:
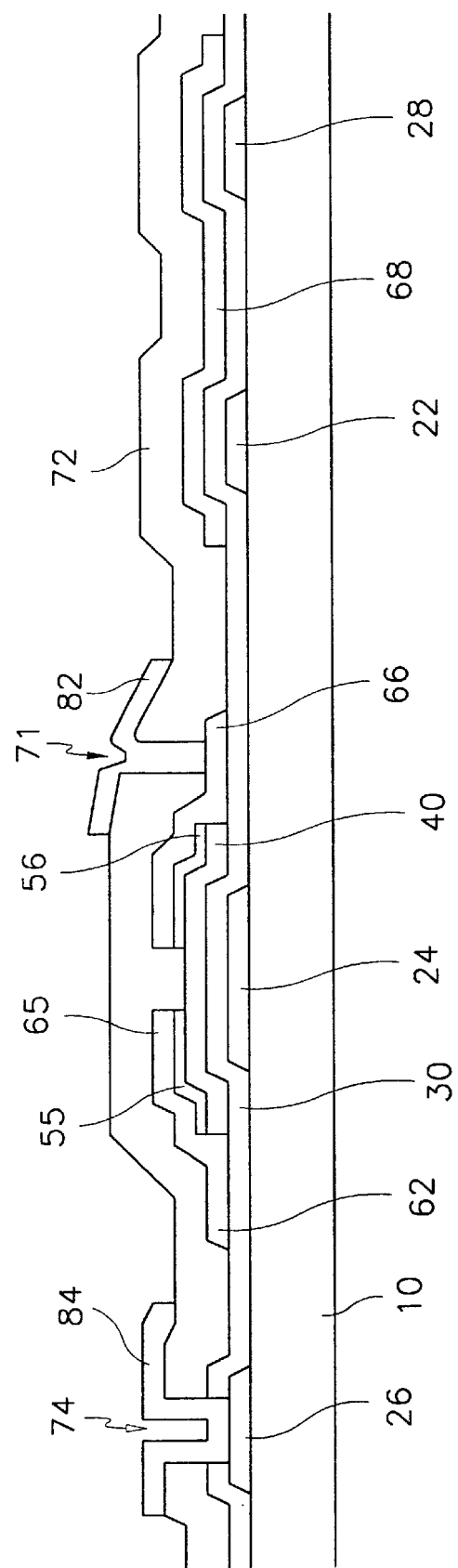
FIG. 3 is a cross-sectional view taken along line III–III' of FIG. 2.

FIG. 2 is a layout view of a thin film transistor array panel for a liquid crystal display according to the first embodiment of the present invention, and FIG. 3 is a cross-sectional view taken along line III–III' of FIG. 2.

As shown in FIGS. 2 and 3, gate wires and storage wires of metal or conductive material such as aluminum (Al) or aluminum alloy, molybdenum (Mo) or molybdenum-tungsten (MoW), chromium (Cr), and tantalum (Ta) are formed on an insulating substrate 10. A gate wire includes a gate line (or scanning signal line) 22 extending in the horizontal direction in FIG. 1 and transmitting a scanning signal, and a gate electrode 24 which is a part of the gate line and one terminal of a thin film transistor. The gate wire may include a gate pad connected to an end of the gate line 22 and transmitting a scanning signal from an external circuit to the gate line 22. A storage wire includes storage electrode lines 26 and 28, which are formed parallel to the gate line 22 and has a dual structure, and a storage electrode 27 connecting the storage electrode lines 26 and 28 to each other. It is provided with a voltage such as a common voltage applied to a common electrode (not shown) on an upper panel of the liquid crystal display. The storage wires 26, 27 and 28 provide storage capacitance along with a pixel electrode 82, which will be described later, to improve the capacitance of a liquid crystal capacitor.

The gate wire parts 22 and 24, and storage wire parts 26, 27, and 28 may have a multiple-layered structure as well as a single-layered structure. When the gate wire parts 22 and 24 and storage wire parts 26, 27, and 28 are formed of multiple layers, it is preferable that one layer is made of a material having a low resistivity and another layer is made of a material having good contacting properties with other materials, particularly ITO (indium tin oxide), for the pixel electrode. This is because the wire and the ITO used for the pixel electrode are used together to reinforce the pad portions electrically connected to the exterior.

A gate insulating layer 30 of silicon-nitride (SiNx) is formed on gate wire parts 22 and 24 and storage wire parts 26, 27, and 28, and covers the same.

A semiconductor pattern 40 (made of a semiconductor such as hydrogenated amorphous silicon) is formed on the gate insulating layer 30. Ohmic contact layer patterns 55 and 56 (made of such materials as amorphous silicon heavily doped with impurities like phosphorus) are formed on the semiconductor pattern 40.

Source and drain electrodes 65 and 66, made of conductive materials such as Mo or MoW, Cr, Al or Al alloy, and Ta, are formed on the ohmic contact layer patterns 55 and 56. A data line 62 formed on the gate insulating layer 30, extending in the vertical direction in FIG. 2, is connected to the source electrode 65 and defines a pixel along with gate line 22. The data wire parts 62, 65, and 66 may include a data pad connected to an end of data line 62. The data pad transmits image signals from an external circuit to the data line 62. Also, a redundant repair line 68 each end of which overlaps the storage electrode lines 26 and 28 of neighboring pixel column is formed in the vertical direction of FIG. 2 on the gate insulating layer 30, on the same layer as the data wire parts 62, 65, and 66. As above described, the storage wire connection line 84 (referring to FIG. 1) may also be formed on the gate insulating layer 30 on the same layer as the data wire parts 62, 65, and 66 along with the redundant repair line 68.

The data wire parts 62, 65, and 66, and the redundant repair line 68 may have a multiple-layered structure like the gate wire parts 22 and 24 and storage wires 26, 27 and 28. Of course, when the data wire has a multiple-layered structure, it is preferable that one layer is made of a material having a low resistivity and another is made of a material having good contacting properties with other materials.

A passivation layer 72 is formed on the data wire parts 62, 65, and 66 and the semiconductor pattern 40, which is not covered by the data wire parts 62, 65, and 66. The passivation layer 72 has a contact hole 71 exposing the drain electrode 66, and contact holes 74 exposing the storage electrode lines 26 and 28 along with the gate insulating layer 30. The passivation layer 72 can be made of an insulating material such as SiNx, acrylic organic material, other transparent photo-definable material, or other organic material.

The pixel electrode 82 that receives an image signal and generates an electric field with a common electrode of an upper panel is formed on the passivation layer 72. The pixel electrode 82 is made of a transparent conductive material such as indium tin oxide (ITO) or indium zinc oxide (IZO), and is connected to the drain electrode 66 through contact hole 71. Also, a storage wire connection line 84 connecting the neighboring storage wires 26, 27, and 28 through the contact hole 74 of the passivation layer 72 and the gate insulating layer 30 is formed on the same layer as the pixel electrode 82. On the other hand, the passivation layer 72 may have contact holes exposing the gate pad and the data pad, and redundant gate and data pads respectively connecting the gate and data pads through the contact holes may be formed on the same layer as the pixel electrode 82.

At this time, as shown FIG. 2, to use the storage wires 26, 27 and 28 as a light blocking layer to block leakage light at the portion adjacent to the edge of the pixel electrode 82, it is preferable that the storage wires 26, 27 and 28 overlap a portion of the edge of the pixel electrode 82. To enhance a wide viewing angle of the LCD, it is desirable that liquid crystal molecules are aligned in a multi-domain configuration. To obtain such a configuration, the pixel electrode 20 may have various pixel division patterns. Here, the pixel electrode 20 may have a plurality of connected squares with rounded corners, an opening pattern in a square shape, a saw-toothed shape or a cross shape to align liquid crystal molecules in a multi-domain configuration by providing a fringe field. To achieve the best viewing angle, it is desirable that a unit pixel is divided into four domains. To achieve stable division alignment, it is desirable that no disinclination or uneven texture is generated except at a boundary of the multi-domain regions, and it is preferable that directors of the liquid crystal molecules in neighboring domains defined by the shapes are arranged at a 90° angle. At this time, leakage light is generated by disinclination or uneven texture, and the storage wires 26, 27 and 28 may have various patterns. Of course, the common electrode (not shown) opposing the pixel electrode 82 may have various opening patterns depending on the patterns of the pixel electrode 82.

In this structure according to the present invention, the redundant repair line 68 or the storage wire connection line 84 is located at every pixel region, and may be located at every plurality of pixel regions.

In these embodiments, transparent ITO is taken as an example of the material of the pixel electrode 82, but an opaque-conductive material may also be used in a reflective type liquid crystal display.

Next, the methods manufacturing the thin film transistor array panel for a liquid crystal display according to the first embodiment of the present invention will be described with referring the drawings.

FIGS. 4A to 4D are cross-sectional views of the thin film transistor array panel for the liquid crystal display of a manufacturing method according to the first embodiment of the present invention.

Figure 4A:
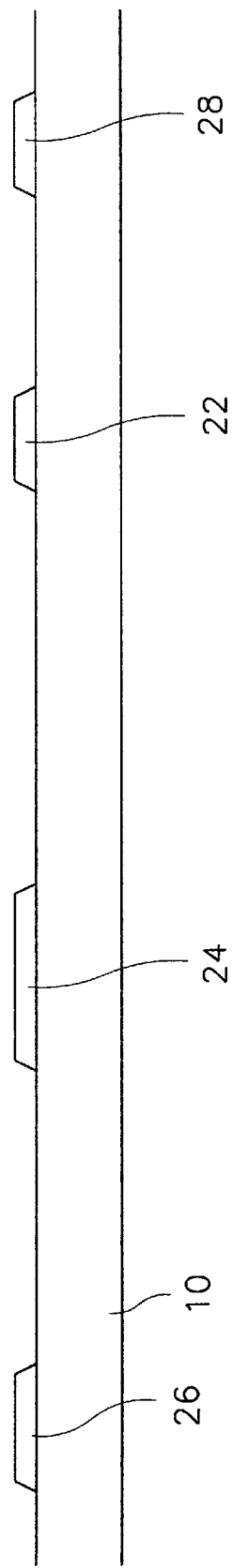
FIGS. 4A to 4D are cross-sectional views of the thin film transistor array panel for the liquid crystal display of a manufacturing method according to the first embodiment of the present invention.

Firstly, as shown in FIG. 4A, a conductive layer having low resistivity is deposited and patterned to form the gate wire parts including the gate line 22 and the gate electrode 24, and the storage wire parts including the storage electrode line 26 and 28, and the storage electrode 27 (referring to FIG. 2) through a photolithography process using a mask on an insulating substrate 10.

Figure 4B:
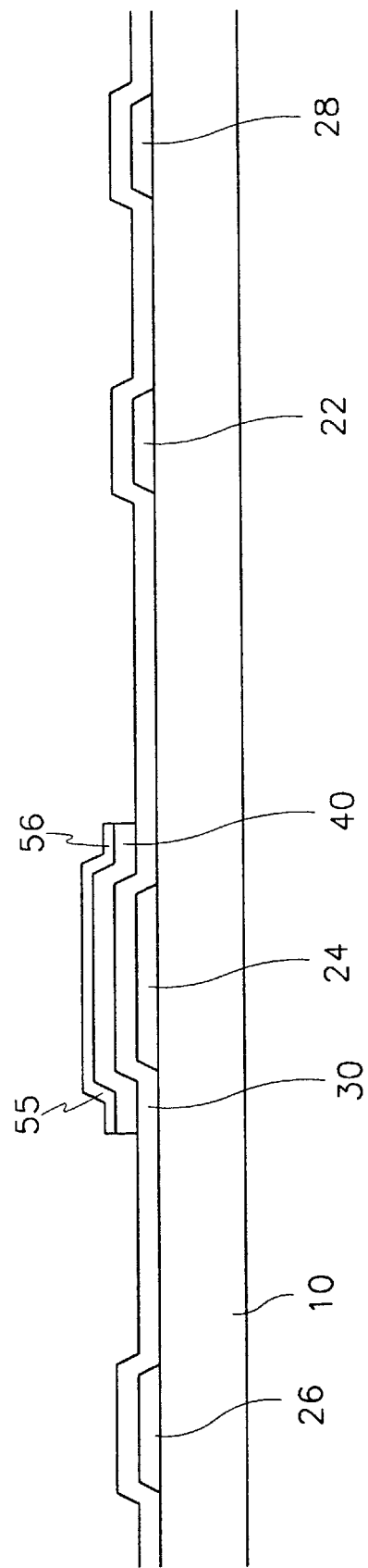

Next, as shown in FIG. 4B, a gate insulating layer 30 made of insulating material such as silicon nitride, a semiconductor layer 40 made of semiconductive material such as amorphous silicon, and an ohmic contact layer 50 made of conductive material such as a doped amorphous silicon are sequentially layered by a chemical vapor deposition method, and the semiconductor layer 40 and the ohmic contact layer 50, which are both island shaped, are formed on top of the gate electrode 24 and the opposing gate insulating layer 30 using a mask patterning process.

Figure 4C:
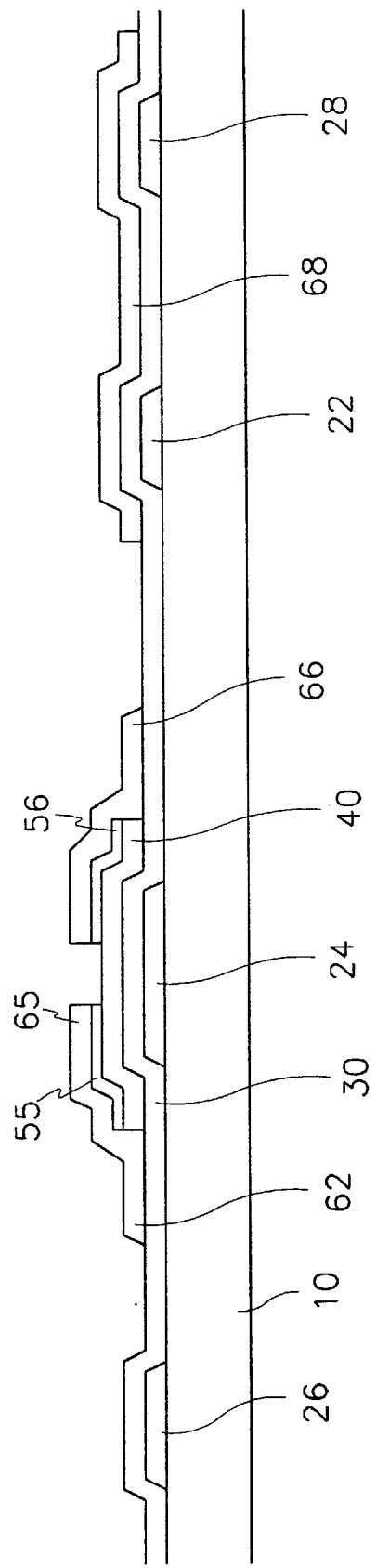

Next, as shown in FIG. 4C, a conductor layer having low resistivity is deposited by such methods as sputtering and patterned through a photolithography process using a mask to form the data wires 62, 65 and 66 (referring to FIG. 2) and the redundant repair line 68.

Then, the ohmic contact layer 50 is etched by using the data wires 62, 65 and 66 as a mask to divide the ohmic contact layer patterns 55 and 56, and the semiconductor layer 40 between the source electrode 65 and the drain electrode 66 is exposed.

Figure 4D:
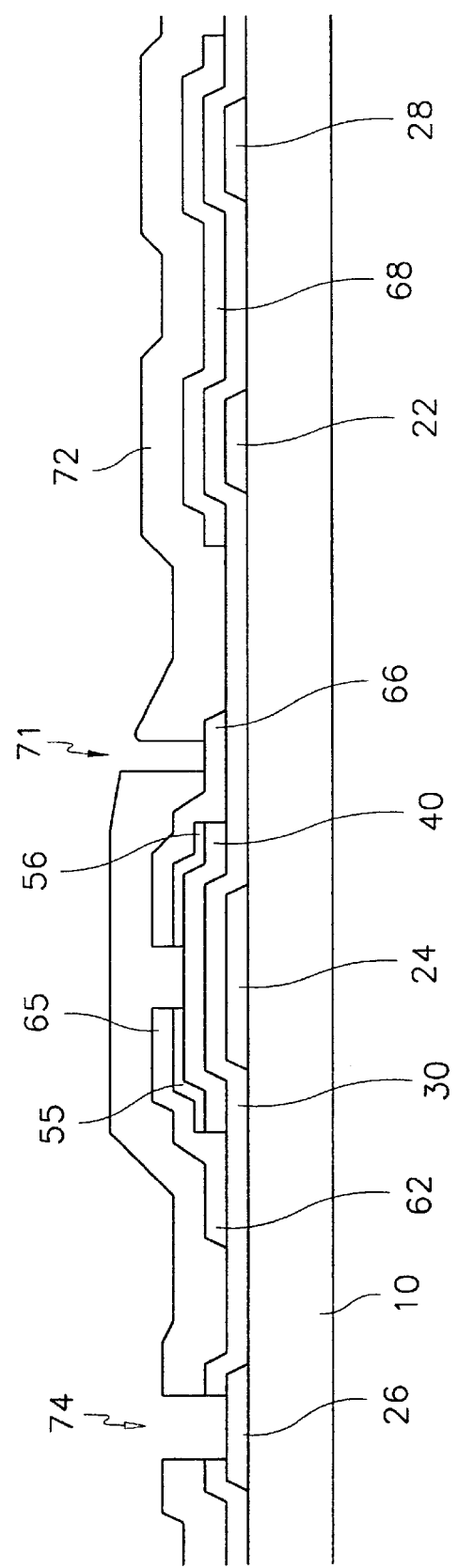

Next, as shown FIG. 4D, a passivation layer 72 is formed by depositing an inorganic insulator such as silicon-nitride (SiNx) or silicon-oxide, or an organic insulator, and patterned along with the gate insulating layer 30 to form contact holes 71 and 74 respectively exposing the drain electrode 66 and the storage wires 26, 27 and 28 (referring to FIG. 2).

Next, as FIGS. 2 and 3, a transparent conductive layer of IZO or ITO is deposited and etched by photolithography using a mask to form the pixel electrode 82 and the storage wire connection line 84.

On the other hand, a method for manufacturing the thin film transistor array panel for a liquid crystal display according to an embodiment of the present invention using four masks will be described with referring to drawings.

FIGS. 5A to 5G are cross-sectional views of the thin film transistor array panel for the liquid crystal display of another manufacturing method according to the first embodiment of the present invention.

Figure 5A:
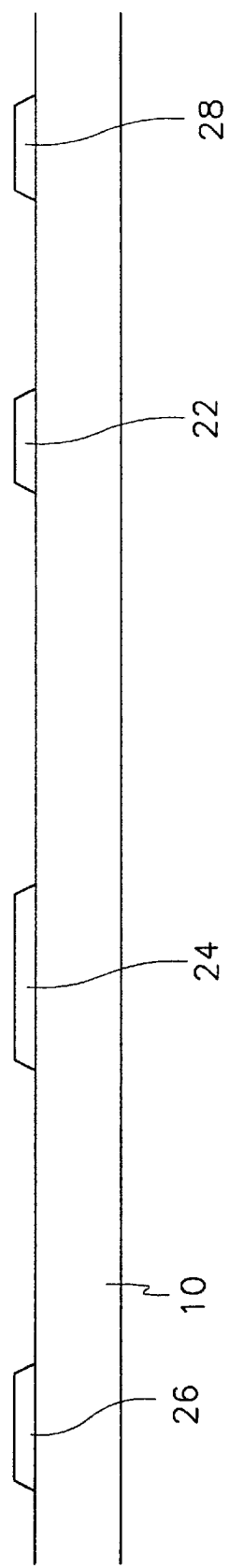

At first, as shown in FIG. 5A, a conductive layer having low resistivity is deposited and patterned to form gate wire parts 22 and 24, and a storage wire parts 26, 27 and 28 by dry or wet etching the conductive layer through a photolithography process.

Next, as shown in FIG. 5A, a gate insulating layer 30, a semiconductor layer 40, and an ohmic contact layer 50 are sequentially deposited respectively by such methods as chemical vapor deposition (CVD). Then, a conductor layer 60 is deposited by such methods as sputtering and a photoresist layer having a thickness of 1 □ to 2 □ is coated on the conductive layer 60.

Figure 5B:
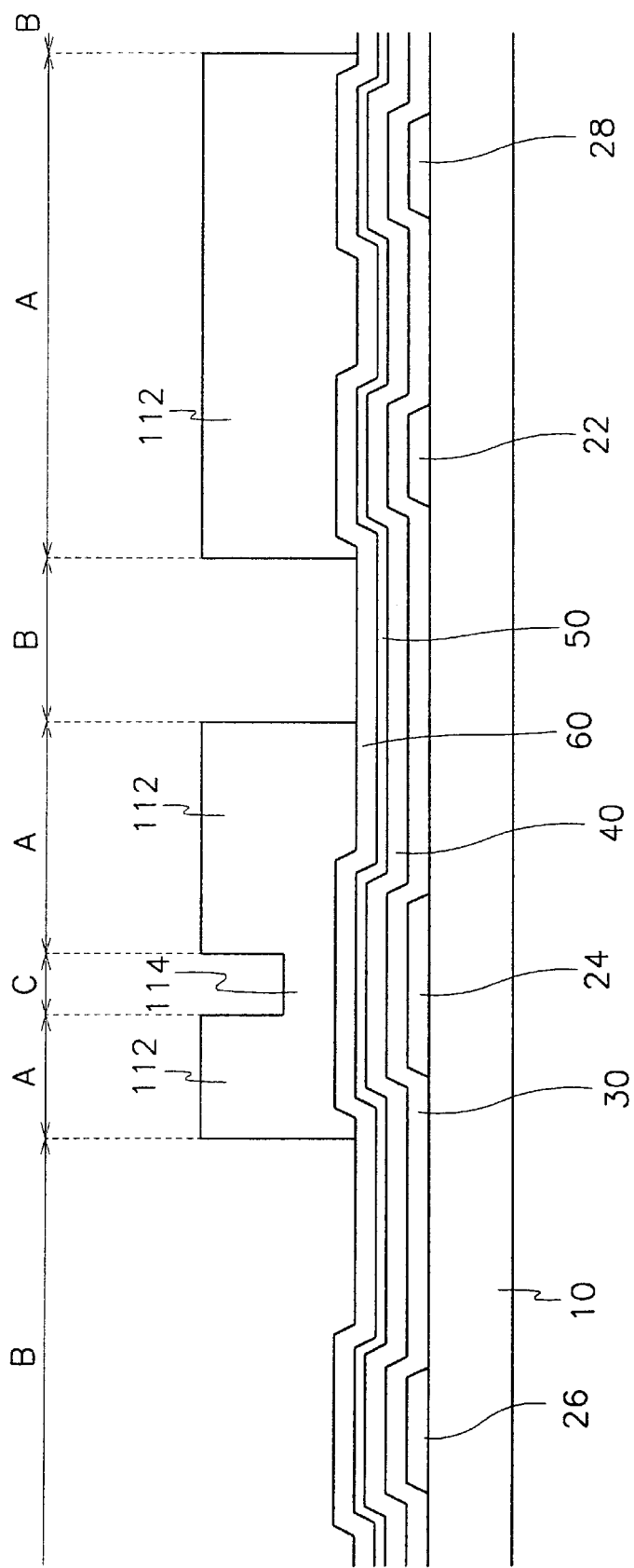

Thereafter, the photoresist layer is exposed to light through a second mask and developed to form photoresist patterns 112 and 114 as shown in FIG. 5B. At this time, the first portion 114 of the photoresist pattern located between a source electrode 65 and a drain electrode 66, i.e., a thin film transistor channel part C as shown in FIG. 5B, is thinner than the second portion 112 of photoresist pattern located over A portion where a data wire parts 62, 65, 66, and a redundant repair line 68 will be formed. Additionally, the third portion, or the remaining portion of the photoresist pattern located at portion B, is thinner than the first portion. The third portion may have a thickness that varies according to the etching method. For example, the third portion has substantially zero thickness when using a wet etch, but the third portion may have a non-zero thickness when using a dry etch. At this time, the thickness ratio between the first portion 114 and the second portion 112 depends on the etch conditions which will be described later. However, it is preferable that the thickness of the first portion 114 is equal to or less than half of that of the second portion 112.

There are many methods to vary the thickness of the photoresist layer according to position, and it is possible to control the amount of incident light of a portion by forming a pattern such as a slit or a lattice, or by providing a partly-transparent layer on the mask.

At this time, it is desirable that the size of the slit and the opaque portion between the slits are smaller than the resolution of the exposure device. When a partly-transparent layer is used, to reduce the amount of exposing light, a mask including films having different transmittances, or having a various thickness may be used.

When the photoresist layer is exposed to light through this mask, the polymers of the photoresist layer are disintegrated by the light. The exposure step is finished when the polymers of a portion, which is directly exposed to the light, are completely disintegrated. However, the polymers of the photoresist layer portion which are exposed through the slits pattern are not completely disintegrated because the amount of incident light is less than that of the directly exposed portion. The polymers of the photoresist layer portion, which are not exposed to light by blocking layer, are hardly disintegrated. After developing the photoresist layers, the photoresist layer portion, which is hardly disintegrated, is nearly remained, and a thinner portion is remained under the portion, which was exposed to a lesser amount of light than the portion, which received full exposure. However, if the exposure time is too long, all the polymers of the photoresist layer are disintegrated. Therefore, such over exposure should be avoided.

The thinner portion 114 may be formed by forming a photoresist layer made of photosensitive and reflowable material, exposing the photoresist layer to light through a mask having respectively substantially transparent portions and substantially opaque portions to form a photoresist pattern having portions of zero and nonzero thicknesseses, and reflowing the photoresist to flow into the zero thickness portions to form a new photoresist pattern.

Referring back to FIG. 12C, the photoresist pattern 114 and the layers thereunder including the conductor layer 60, the ohmic contact layer 50, and the semiconductor layer 40 are next subjected to an etching process. When this is done, a data wire and a redundant repair line, and the layers thereunder at the A portion may be left, as well as only the semiconductor layer on the channel part C. In addition, three layers 60, 50, and 40 in the remaining part B are removed from the gate insulating layer 30.

Figure 5C:
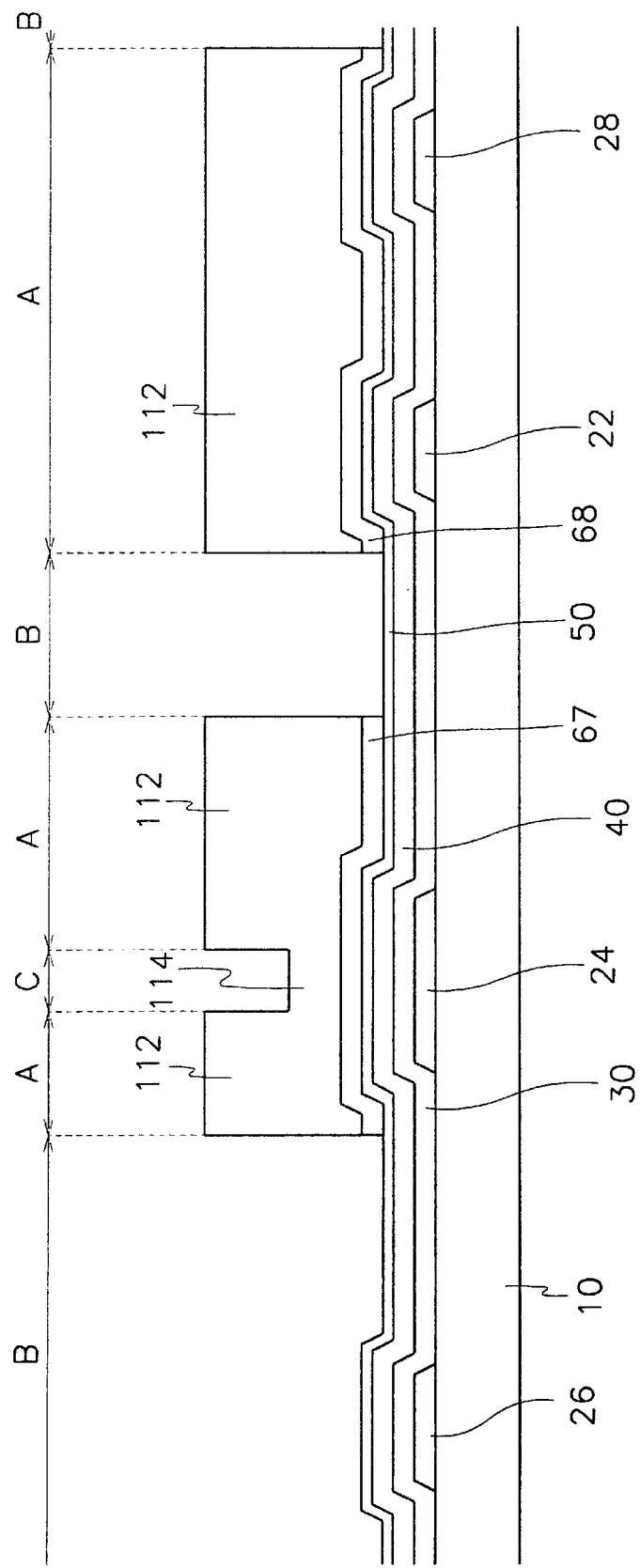

As shown in FIG. 5C, the ohmic contact layer 50 of the part B is exposed by removing the conductor layer 60 thereon. At this time, both wet and dry etch can be used, and it is preferable that the etch is performed under a condition such that the conductor layer 60 is etched but the photoresist layers 112 and 114 are not etched. However, since it is hard achieve this in the case of a dry etch, the etch may be performed under a condition that the photoresist patterns 112 and 114 is also etched. In this case, the first portion 114 may be made thicker than in the wet etch case so that the conductor layer 60 is not exposed.

If the conductor layer 60 is made of Mo or MoW alloy, Al or Al alloy, or Ta, both dry or wet etch methods can be used. However, if the conductor layer 60 is made of Cr, a wet etch is better because Cr is not easily removed by dry etch. $CeNHO_3$ is available as a wet etchant for etching a Cr conductor layer 60. The mixed gas system systems of $CF_4$ and HCl or $CF_4$ and $O_2$ is available for dry etching a Mo or MoW conductor layer 60, and in this case, the etch rate of the latter system on the photoresist layer is similar to that of the conductor layer 60.

Referring to FIG. 5C, as a result, only the portions of the conductor 67 and 68 under the photoresist layers 112 and 114 at the channel part C and the A portion for source/drain electrodes and a redundant repair line are left, and the remaining portion of the conductor layer 60 at part B is wholly removed to expose the ohmic contact layer 50 thereunder. At this time, the conductor patterns 67 and 68 have the same layout as the data wire parts 62, 65, 66, and the redundant repair part 68 except that the source electrode 65 and the drain electrode 66 are connected to each other. When a dry etch is used, the photoresist layers 112 and 114 are also etched to a certain thickness.

Next, the exposed portions of the ohmic conductor layer 50 at part B, and the semiconductor layer 40 thereunder of FIG. 5D are removed by dry etching along with first portion 114 of the photoresist layer. The etch condition may be such that the photoresist patterns 112 and 114, the ohmic contact layer 50 and the semiconductor layer 40 are all etched (the semiconductor layer and the ohmic contact layer have almost the same etch rate), but the gate insulating layer 30 must be not etched. It is preferable that the etch rates of the photoresist patterns 112 and 114 and the semiconductor layer 40 are almost the same. This occurs, for example, with the mixed gas systems of $SF_6$ and HCl or $SF_6$ and $O_2$. At this time, if the etch rates of the photoresist patterns 112 and 114, the semiconductor layer 40 are almost the same, the thickness of the first portion 114 is equal to or less than that of the sum of the semiconductor layer 40, and the ohmic contact layer 50.

Then, as shown in FIG. 5D, the conductor pattern 67 is exposed by removing the first portion 114 of the channel part C, and the gate insulating layer 30 are exposed by removing the ohmic contact layer 50, and the semiconductor layer 40 of the part B. At the same time, the thickness of the second portion 112 over the A portion is reduced by etching. Furthermore, the completed semiconductor patterns 40 are obtained at this step.

The remaining photoresist layer on the conductor pattern 67 is then removed by ashing or plasma etching.

Figure 5E:
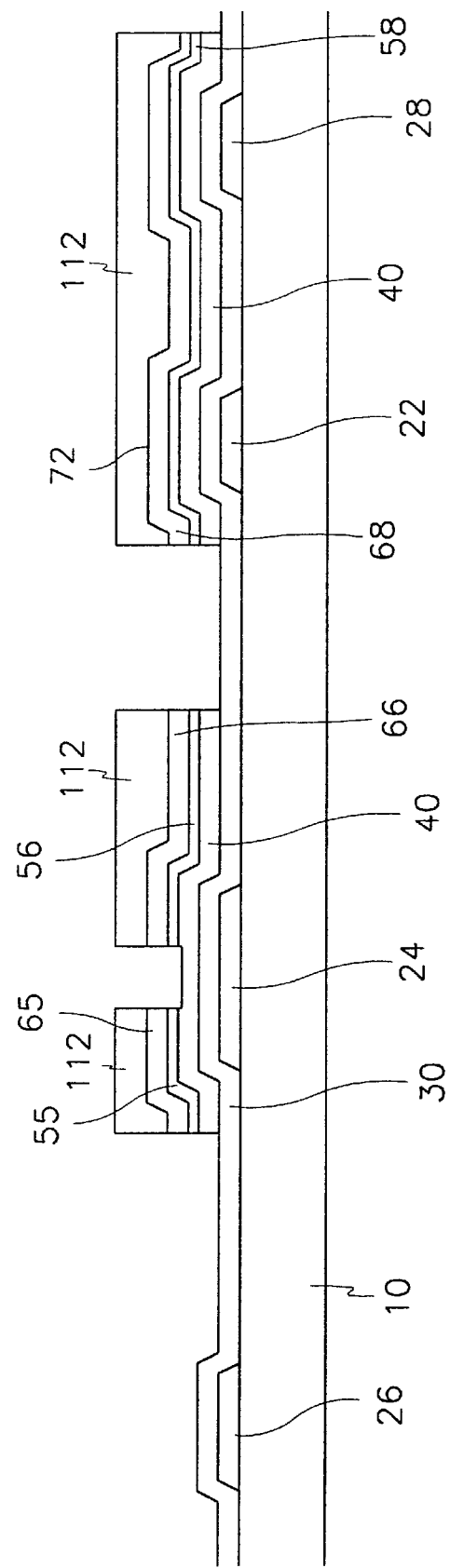

Next, as shown in 5E, the conductor pattern 67 for source/drain electrodes at the channel part C and the ohmic contact layer pattern 50 for source/drain electrodes of FIG. 5E are removed by etching. At this time, it is possible either to etch both the conductor pattern 67 and the ohmic contact layer 50 by a dry etching method, or to etch the conductor pattern 67 by a wet etching method and the ohmic contact layer 50 by a dry etching method. It is preferable in the former case that etch conditions having large etch selectivity between the conductor pattern 67 and the ohmic contact layer pattern 50 are employed. This is because if the etch selectivity is not large enough, it is hard to detect the end point of the etch and to control the thickness of the semiconductor pattern 40 around the channel part C. This can be achieved by using a mixed gas system of $SF_6$ and $O_2$, for example. In the latter case of doing the wet etch and the dry etch sequentially, the lateral sides of the conductor pattern 67 subjected to wet etch are also etched although those of the ohmic contact layer pattern 50, which is dry etched, are hardly etched at all. Thereby, the profile of these two patterns 67 and 50 makes a step like form. The mixed gas systems of $CF_4$ and $O_2$, or $CF_4$ and HCl are examples of an etch gas system for etching the ohmic contact layer pattern 50 and the semiconductor pattern 40. The semiconductor pattern 40 may also be formed to have a uniform thickness by etching with the mixed gas system of $CF_4$ and $O_2$. At this time, as shown in FIG. 5E, the thickness of the semiconductor pattern 40 may be reduced and the second portion 112 of the photoresist pattern is also etched to a certain thickness. The etch conditions may also be set not to etch the gate insulating layer 30, and it is preferable to make the photoresist pattern thick enough not to expose the data wire parts 62, 65, 66 and the redundant repair line 68.

As a result, the source electrode 65 and the drain electrode 66 are divided, and the completed data wire parts 62, 65, 66, and the redundant repair line 68 and the completed contact layer pattern 55 and 56 thereunder are obtained.

Next, the remaining second portion 112 of the photoresist layer on the data wire is removed. However, this removal of the second portion 112 may be performed after the step removing the conductor pattern 67 for source/drain electrodes on the channel part C and before the step removing of the ohmic contact layer pattern 50 under the conductor pattern 67.

To summarize, this process can be done by using both wet etching and dry etching in turn, or by using only dry etching.

In the former case, the conductor layer of the part B is first remove by wet etching, and then the ohmic contact layer and the semiconductor layer thereunder are removed by dry etching. At this time, the photoresist layer of the part C is consumed to a certain thickness, and the part C may have or may not have any residual photoresist left, which substantially depends on the initial thickness of the photoresist layer of the part C. When the part C has residual photoresist left, this residual photoresist is removed by ashing. Finally, the conductor layer of the part C is wet etched to separate the source and the drain electrodes, and the ohmic contact layer of the part C is removed by using dry etching.

In the latter case, the conductor layer, the ohmic contact layer, and the semiconductor layer of the part B are removed by dry etching. As in the former case, the part C may have or may not have residual photoresist left, and residual photoresist is removed by ashing when part C does have any residual photoresist. Finally, the conductor layer of the part C is dry etched to separate the source and the drain electrodes, and the ohmic contact layer of the part C is removed by using dry etching.

Also, if the data wire is etched, the semiconductor pattern, the contact layer pattern, and the data wire may be completed with the same step at one time. That is to say, it is desirable that the photoresist pattern 114 and the contact layer 50 thereunder of the part C are dry etched, and the portion of the photoresist pattern 112 of the part A is dry etched during the dry etching of the conductor layer, the ohmic contact layer, and the semiconductor layer of the part B.

Since the latter process uses only one type of etching method, it is simpler, although it is harder to achieve proper etching conditions. On the other hand, the former process has the advantage of ease of achieving proper etching condition, although it is more complicated.

Figure 5F:
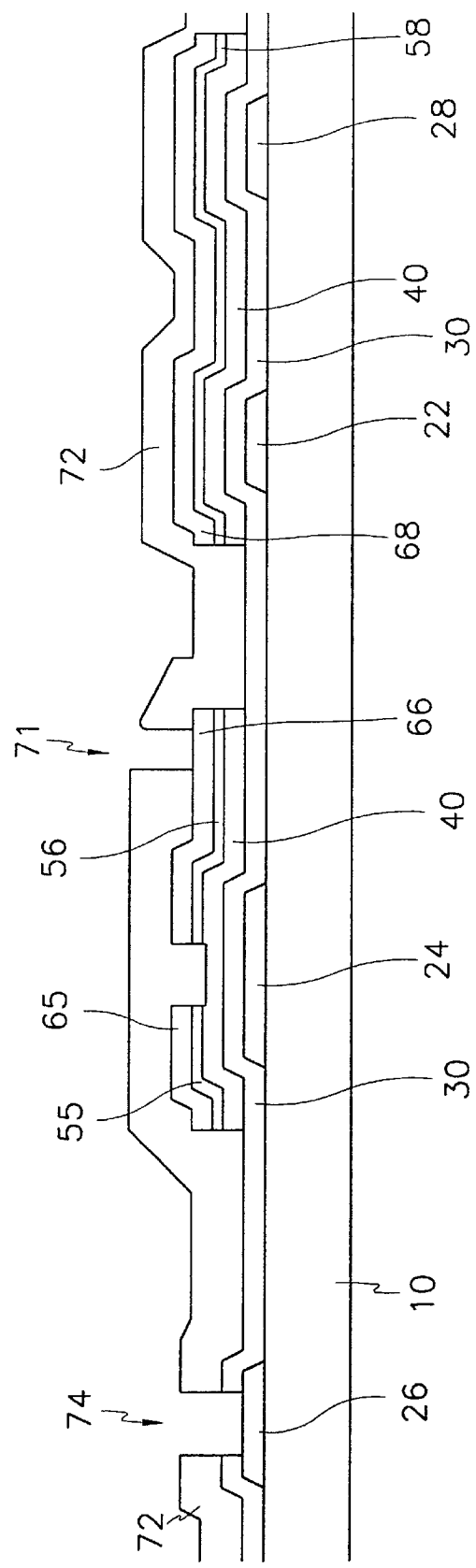

After forming data wire parts 62, 65, 66, and the redundant repair line 68 by the above steps, a passivation layer 70 is formed by such methods as chemical vapor deposition (CVD), as shown in FIG. 5F.

Figure 5G:
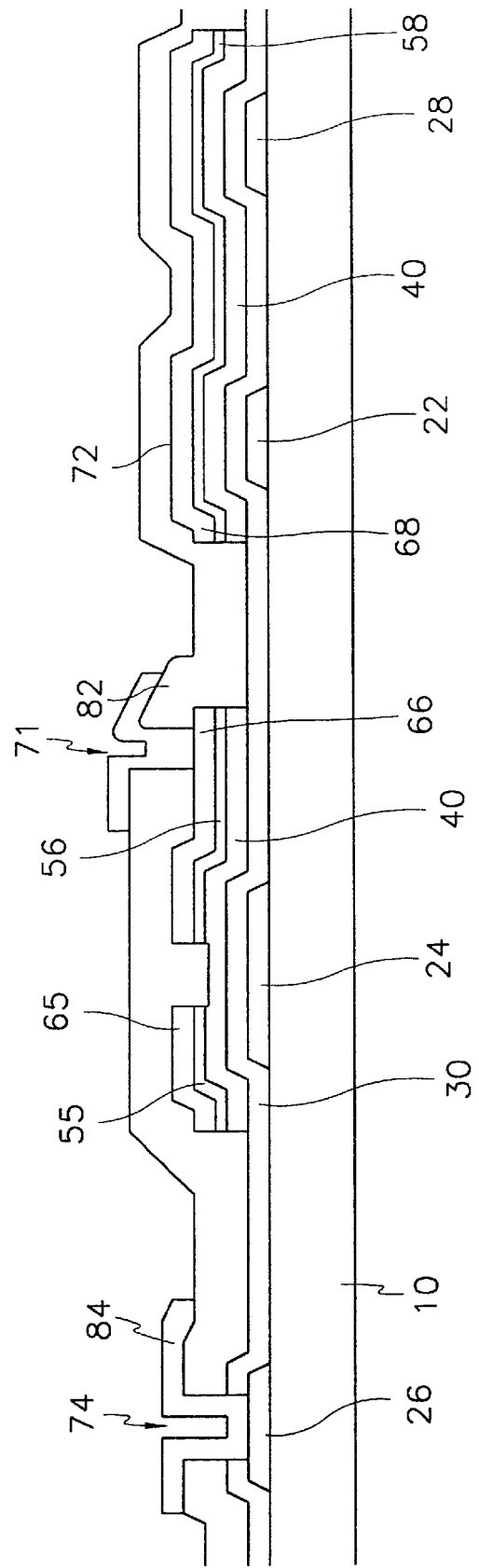

Next, the passivation layer 70 is patterned along the gate insulating layer 30 through photolithography processes using a mask to form contact holes 71 and 74 exposing respectively the drain electrode 66, and the storage wire, as shown in FIG. 5G.

Next, as above described, a IZO layer or a ITO layer is deposited and etched by using a mask to form a pixel electrode 82 connected to the drain electrode 66. at this time, a storage wire connection line 84 electrically connecting the storage wire 26, 27 and 28 of neighboring pixels through contact hole 74.

In the this embodiment having the same effects as that of the first embodiment, by forming the data wire parts 62, 65, 66, and the redundant repair line 68, the ohmic contact layer pattern 55, and 56, and the semiconductor patterns 40 through one photolithography process, the manufacturing method of the thin film transistor array panel may be also simplified.

In this case, the semiconductor layer 40, the ohmic contact layer pattern 55 and 56 are formed according to the data wire 62, 65, 66, is different from the structure of FIGS. 2 and 3. The ohmic contact layer patterns 55, and 56 have the same layout as the data wire parts 62, 65, 66. The semiconductor layer 40 except for channel portion between the source electrode 65 and the drain electrode 66 has the same layout as the data wire parts 62, 65 and 66, and the ohmic contact layer pattern 55 and 56. Of course, a semiconductor layer and an ohmic contact layer may be remained under the redundant repair line 68.

This thin film transistor array panel according to the first embodiment having the storage wire connection line may be used as one panel of a liquid crystal display of twisted nematic (TN) mode or vertical align (VA) mode.

Figure 6:
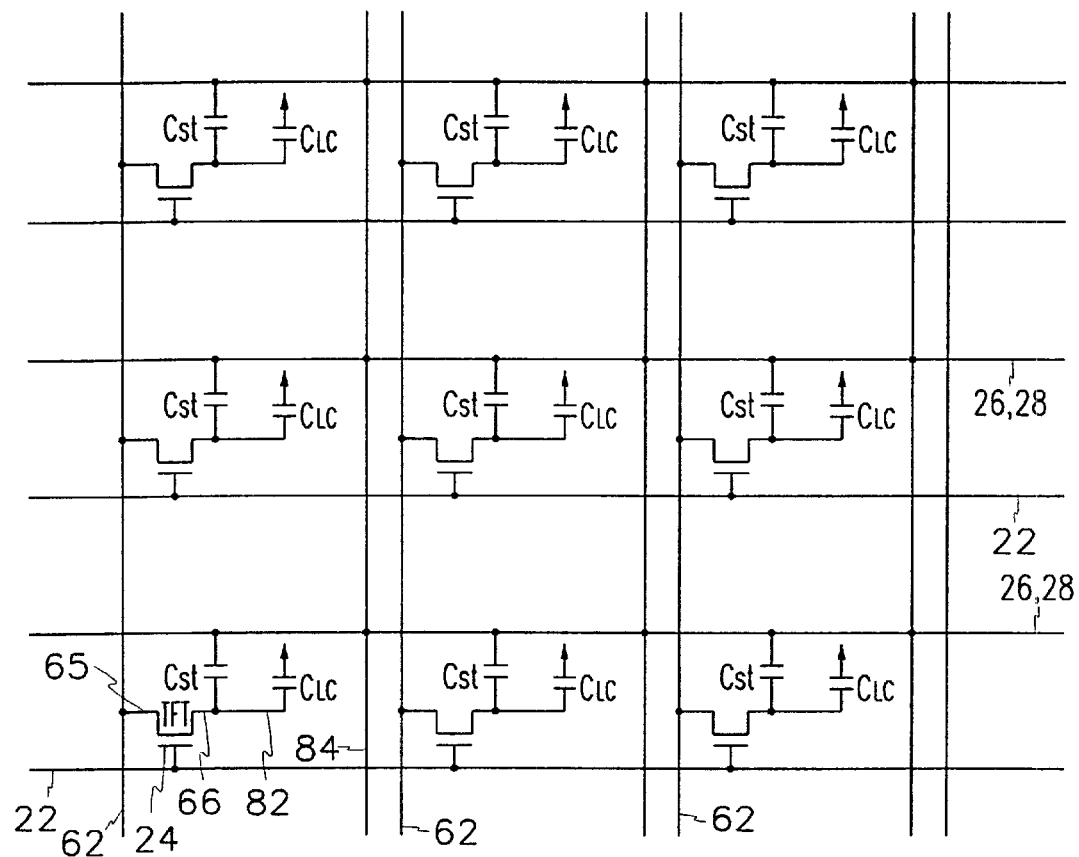
FIG. 6 is a circuit view of a thin film transistor array panel for a liquid crystal display according to the first embodiment of the present invention.

FIG. 6 is a circuit view of a thin film transistor array panel for a liquid crystal display according to the first embodiment of the present invention.

As shown in FIG. 6, a plurality of gate lines 22 transmitting a scanning signal and a plurality of data lines 62 transmitting a display signal or an image signal cross each other. The gate lines 22 and the data lines 62 define a plurality of pixels in a matrix array. Each pixel includes a thin film transistor TFT having a gate electrode 24 connected to the gate line 22, a source electrode 65 connected to the data line 62, and the drain electrode 65 connected to the pixel 82. Also, each pixel includes a storage capacitor $C_{st}$ generating storage capacitance, and having two terminals of the pixel electrode 82 and storage electrode lines 26 and 28 and a liquid crystal capacitor $C_{LC}$ generating liquid crystal capacitance, and having two terminals of the pixel electrode 82 and a common electrode (not shown), which is formed on an upper panel of the liquid crystal display. A plurality of storage wire connection line 84 at least electrically connecting storage wires 26, 27 and 28 of neighboring pixels is formed in a vertical direction. Here, the storage wire connection lines 84 are formed in each pixel.

On the other hand, a thin film transistor array panel for a liquid crystal display of in-plane switching mode (IPS) having pixel electrodes and common electrodes, which are formed with the same panel, to form electrode field rearranging liquid molecules may be have a storage wire connection line at least electrically connecting storage wires of neighboring pixels, will be described with referring to FIGS. 7 and 8.

Figure 7:
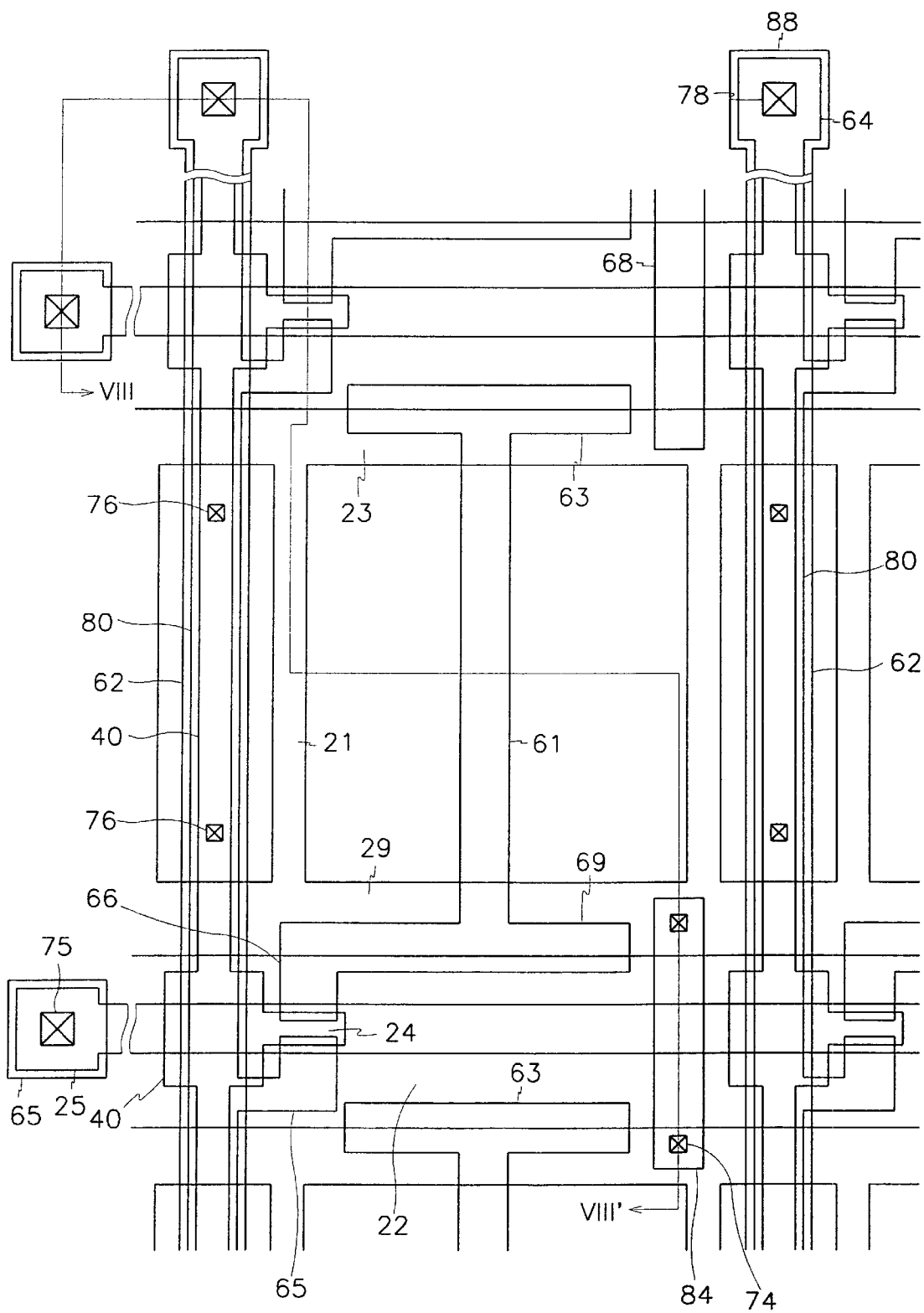
FIG. 7 is a layout view of a thin film transistor array panel for a liquid crystal display according to the second embodiment of the present invention.
Figure 8:
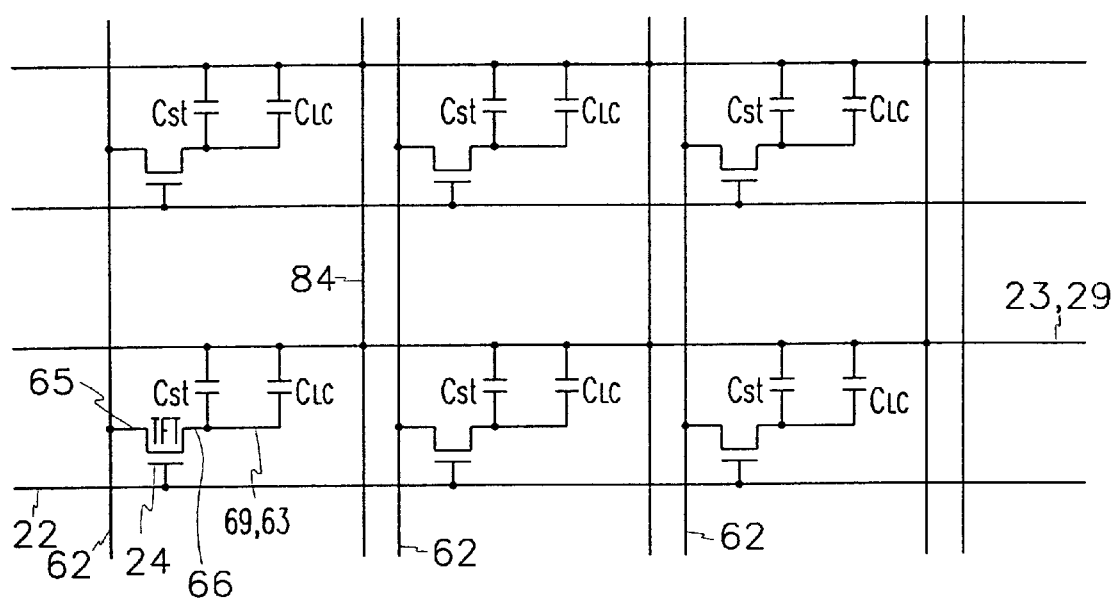
FIG. 8 is a cross-sectional view taken along line VIII–VIII' of FIG. 2.

FIG. 7 is a layout view of a thin film transistor array panel for a liquid crystal display according to the second embodiment of the present invention, and FIG. 8 is a cross-sectional view taken along line VIII–VIII' of FIG. 7.

As shown in FIGS. 7 and 8, gate wires and common wires of metal or conductive material are formed on an insulating substrate 10. A gate wire includes a gate line (or scanning signal line) 22 extending in the horizontal direction in FIG. 7 and transmitting a scanning signal, a gate electrode 24 which is a part of the gate line 22 and one terminal of a thin film transistor, and a gate pad connected to an end of the gate line 22 and transmitting a scanning signal from an external circuit to the gate line 22. A common wire includes common electrode lines 23 and 29, which is formed parallel to the gate line 22 and has a dual structure, and commons electrodes 21 connected to two storage electrode lines 23 and 29. The storage wires 23 and 29 provide storage capacitance along with pixel electrode lines 63 and 69, which will be described later, to improve the capacitance of a liquid crystal capacitor.

A gate insulating layer 30 of silicon-nitride (SiNx) is formed on gate wire parts 22, 24 and 25 and storage wire parts 21, 23, and 29, and covers the same.

A semiconductor pattern 40 (made of a semiconductor such as hydrogenated amorphous silicon) is formed on the gate insulating layer 30. Ohmic contact layer patterns 55 and 56 (made of such materials as amorphous silicon heavily doped with impurities like phosphorus) are formed on the semiconductor pattern 40. Here, the semiconductor pattern 40 is extended in the vertical direction according to a data line 62, which will be described later, and the portion of the semiconductor pattern 40 on which the gate line 22 and the data line 62 overlap to each other is wider than the different portion of the semiconductor pattern 40 to minimize the disconnection of the data line 62.

Source and drain electrodes 65 and 66, made of conductive materials are formed on the ohmic contact layer patterns 55 and 56. The data line 62 formed on the gate insulating layer 30, extending in the vertical direction in FIG. 7, is connected to the source electrode 65 and defines a pixel along with gate line 22. The data wire parts 62, 65, and 66 includes a data pad 64 connected to an end of data line 62. The data pad transmits image signals from an external circuit to the data line 62. Also, a pixel wire parts including pixel electrode lines 63 and 69, which are extended in the horizontal direction and provide storage capacitance by overlapping the common electrode lines 23 and 29, and pixel electrode 61, which is connected to the pixel electrode lines 63 and 69 and generates electric field nearly parallel the substrate 10 along with the common electrodes 21 to control liquid crystal molecules, is formed on the gate insulating 30. The pixel wire parts 61, 63 and 69 are connected to the drain electrode 66. A redundant repair line 68 both ends of which overlap the common electrode lines 22 and 29 of neighboring pixel column may be formed in the vertical direction of FIG. 7 on the gate insulating layer 30, on the same layer as the data wire parts 62, 65, and 66. As above described, the storage wire connection line 84 (referring to FIG. 1) may also be formed on the gate insulating layer 30 on the same layer as the data wire parts 62, 64, 65, and 66.

A passivation layer 72 is formed on the data wire parts 62, 64, 65, and 66 and the semiconductor pattern 40, which is not covered by the data wire parts 62, 64, 65, and 66. The passivation layer 72 has a contact hole 74 exposing the common electrode lines 23 and 29, contact holes 75 and 78 exposing the gate pad 25 and the data pad 64, contact holes 76 along with the gate insulating layer 30.

A redundant data wire parts made on conductive material such as metal is formed on the passivation layer 72. The redundant data wire include a redundant data line 80 connected to the data line 62 through contact holes 76 and a redundant data pad 88 connected to the data pad 64 through contact holes 78. Also, redundant gate pads 85, which are connected to the gate pad 25 through contact hole 75, common wire connection lines 84 connecting the neighboring common wires 21, 23, and 29 through the contact hole 74 of the passivation layer 72 and the gate insulating layer 30 are formed on the passivation layer 72. The redundant data wire 80 and 88, and the redundant gate pad 85 may be formed of a transparent conductive material such as indium tin oxide (ITO) or indium zinc oxide (IZO) to improve reliability of pad portions.

Next, the methods manufacturing the thin film transistor array panel for a liquid crystal display according to the second embodiment of the present invention will be described with referring the drawings.

Most of a manufacturing method according to the second embodiment of the present invention is the same as that of the first embodiment.

However, the common wires 21, 23 and 29 are formed when forming the gate wires 22, 24 and 25, and the pixel wires 61, 63 and 69 are formed when forming the data wire 62, 64, 65 and 66. Then, the redundant data wires 80, 85 and 88 are formed on the passivation layer 72.

Figure 9:
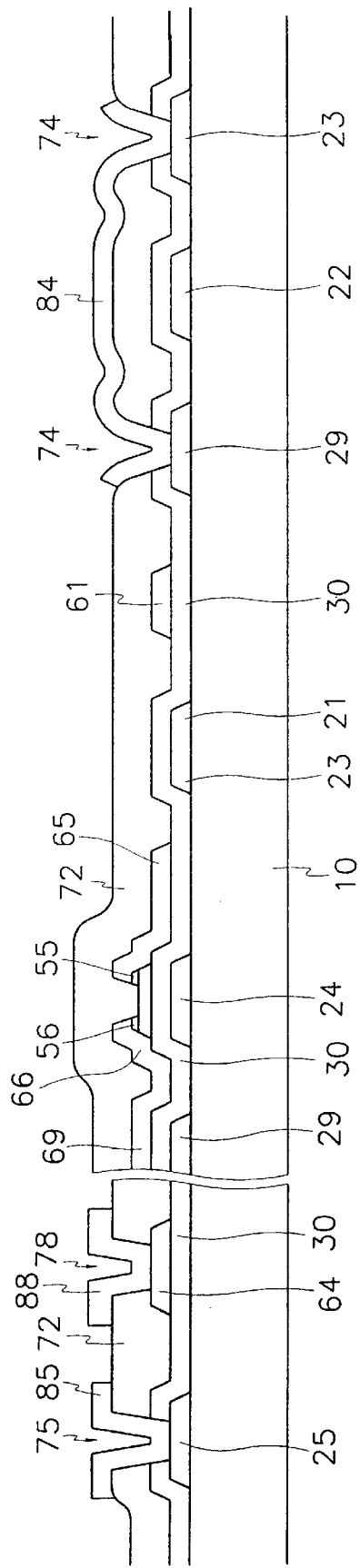
FIG. 9 is a circuit view of a thin film transistor array panel for a liquid crystal display according to the second embodiment of the present invention.

FIG. 9 is a circuit view of a thin film transistor array panel for a liquid crystal display according to the second embodiment of the present invention.

Most of a structure according to the second embodiment is the same as that according to the first embodiment of FIG. 6.

However, two terminals of storage capacitors $C_{st}$ and liquid crystal capacitors $C_{LC}$ are connected to the pixel wires 63 and 69, and the common wires 23 and 29, respectively.

In the present invention, by forming the storage wire connection line at least connecting the storage wires of neighboring pixels to each other, the variation of the voltage for the storage capacitance may be minimized, and this results in a reduction of distortion such that crosstalk and flicker problems are minimized. Also, by using the redundant repair line and the storage wire connection line, open defects of the gate line and the data line may be easily repaired.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A thin film transistor array panel for a liquid crystal display, comprising:

a gate wire including gate lines formed in a horizontal direction;

a data wire including data lines formed in a vertical direction, where said data wire intersects and is insulated from said gate wire;

a pixel electrode formed in a pixel defined by an intersection of the gate line and the data line, receiving image signals through the data line;

a storage wire including storage electrode lines and storage electrodes connected to the storage electrode lines, wherein the storage wire forms a storage capacitance by overlapping said pixel electrode; and a redundant repair line both ends of which overlap the storage wire of neighboring pixels.

2. The thin film transistor array panel of claim 1, further comprising a storage wire connection line at least connecting the storage wires to neighboring pixels.

3. The thin film transistor array panel of claim 2, wherein the storage wire connection line is formed on the same layer as said pixel electrode.

4. The thin film transistor array panel of claim 1, wherein said redundant repair line is formed on the same layer as said data wire.

5. The thin film transistor array panel of claim 1, wherein said storage wires are formed on the same layer as said gate wire.

6. The thin film transistor array panel of claim 1, wherein said storage wire overlaps an edge portion of the pixel electrode.

7. The thin film transistor array panel of claim 1, wherein the pixel electrode has a plurality of connected squares with rounded corners, an opening pattern in a square shape, saw-toothed shape or cross shape to align liquid crystal molecules in a multi-domain configuration.

8. A thin film transistor array panel for a liquid crystal display, comprising:

an insulating substrate;

a gate wire formed on the insulating substrate, wherein said gate wire includes a gate line formed in a horizontal direction and transmitting a scanning signal, and a gate electrode connected to the gate line;

a storage wire formed on the insulating substrate, wherein said storage wire includes a storage electrode line formed in a horizontal direction, and a storage connected to the storage electrode line;

a gate insulating layer covering said gate wire and said storage wire;

a semiconductor layer formed on the gate insulating layer and made of semiconductor material;

a data wire including a data line formed in a vertical direction, a source electrode connected to the data line and extended on the semiconductor layer, and a drain electrode extended on the semiconductor layer and separated from the source electrode with respect to the gate electrode, wherein the data line defines a pixel of a matrix array by intersecting the gate line;

a passivation layer covering said semiconductor layer;

a pixel electrode formed over a pixel connected to drain electrode, wherein said pixel electrode forms a storage capacitance by overlapping the storage wire; and a redundant repair line both ends of which overlap the storage wires of a neighboring pixels.

9. The thin film transistor array panel of claim 8, wherein the pixel electrode and the redundant repair line are formed on the same layer as each other.

10. The thin film transistor array panel of claim 7, wherein the pixel electrode and the storage wire connection line are formed on said passivation layer.

11. The thin film transistor array panel of claim 6, further comprising a storage wire connection line at least connecting the storage wires of neighboring pixels.

* * * * *